Figure 1:
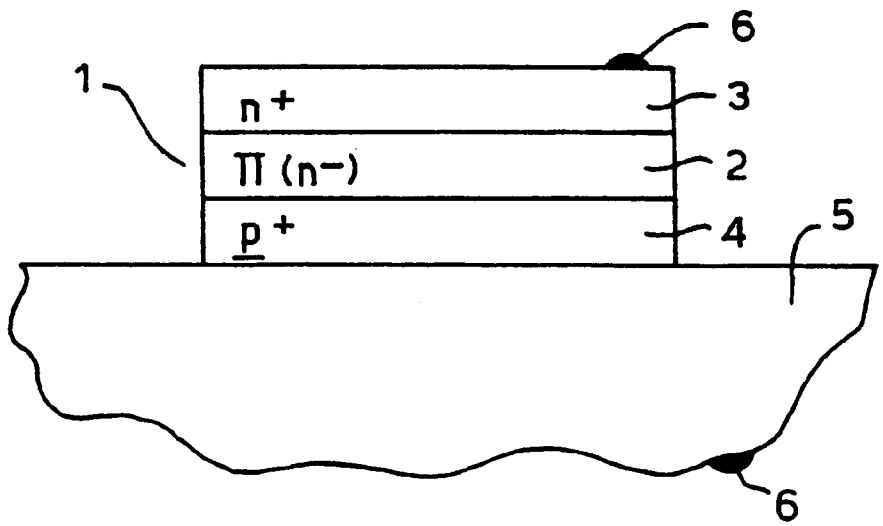

United States Patent [19]
White

[11] Patent Number: 6,081,019
[45] Date of Patent: Jun. 27, 2000

[54] SEMICONDUCTOR DIODE WITH SUPPRESSION OF AUGER GENERATION PROCESSES

[75] Inventor: Anthony M White, Malvern, United Kingdom

[73] Assignee: The Secretary of State for Defence in Her Britannic Majesty's Government of the United Kingdom of Great Britain and Northern Ireland, Farnborough, United Kingdom

[21] Appl. No.: 09/043,995

[22] PCT Filed: Sep. 30, 1996

[86] PCT No.: PCT/GB96/02403

§ 371 Date: Mar. 30, 1998

§ 102(e) Date: Mar. 30, 1998

[87] PCT Pub. No.: WO97/13278

PCT Pub. Date: Apr. 10, 1997

[30] Foreign Application Priority Data

Oct. 5, 1995 [GB] United Kingdom .................. 9520324

[51] Int. Cl.[7] .................................................. H01L 31/00
[52] U.S. Cl. ....................... 257/448; 257/442; 257/614; 257/656
[58] Field of Search .................................. 257/458, 442, 257/614, 656

[56] References Cited

U.S. PATENT DOCUMENTS 5,016,073  5/1991  Elliott et al. ............................. 357/30
5,382,814  1/1995  Ashley et al. ........................... 257/197

FOREIGN PATENT DOCUMENTS 0 193 462   2/1986  European Pat. Off. .
WO 90/06597  6/1990  WIPO .

OTHER PUBLICATIONS

Ashley, T., et al., "Non-equilibrium devices for infrared detection," SPIE vol. 572, Infrared Technology XI, pp. 123–132, Aug. 1985.

Orsal, Bernard, et al., "HgCdTe 1.6 to 2.5 um Avalanche Photodiode . . . ," IEEE Transactions on Electron Devices, vol. 38, No. 8, pp. 1748–1756, Aug. 1991.

Belotelov, S.V., et al., "Luminescence emitted by implanted CdHgTe layers . . . ," Soviet Physics, Semiconductors, 25(6), pp. 637–641, Jun. 1991.

Elliott, C.T., et al., "MOVPE grown heterojunction diodes in HgCdTe," SPIE vol. 2269 Infrared Technology XX, pp. 648–657, Jul. 1994.

*Primary Examiner*—Sara Crane
*Attorney, Agent, or Firm*—Nixon & Vanderhye P.C.

[57] ABSTRACT

A multi-layer Auger suppressed diode having at least two exclusion interfaces and at least two extraction interfaces. A specific embodiment has two composite contacts, each consisting of a heavily doped layer (3, 4) and a buffer layer (8, 9) of lower doped, high bandgap material sandwiched between the heavily doped layer and the active region (2) of the device.

13 Claims, 1 Drawing Sheet

SEMICONDUCTOR DIODE WITH SUPPRESSION OF AUGER GENERATION PROCESSES

This invention relates to a semiconductor diode structure which gives rise to improved performance at room temperatures.

Narrow gap semiconductors have hitherto found few applications around room temperatures because the intrinsic carrier concentrations are so high that they mask doping concentrations and lead to very high thermal generation rates with high leakage currents, high noise and low radiative efficiency in emitters. Therefore they are typically cooled.

In order to capitalise on the potentially very high speed and very low power dissipation of narrow gap devices, Auger Suppressed devices were invented (see for example Proc. SPIE, Infra-red Technology XI Vol 572 (Aug 20, San Diego Calif.) 1085, pp. 123–132). By electronic means the carrier concentrations in an active zone are reduced even at ambient temperatures or above so that extrinsic behaviour is achieved.

This is done by sandwiching a low doped layer between two contacting zones with interfaces of special properties. The first zone forms an excluding interface and might have high doping of the same type as the active zone, high band gap, low doping same type or a combination of both features. The important feature of the first zone is that the minority concentration is very low so that in reverse bias (that which drives minority carriers in an active zone away from the interface) carriers are removed from the active zone without replenishment from the first zone. The interface between such a zone and the layer into which minority carriers cannot pass (in this case the active layer) is known in an excluding interface.

In cadmium mercury telluride (CMT), for example, at room temperature this phenomenon exists over a wide range of material parameters. It is sufficient only that the minority carrier concentration in the contacting zone is lower than in the active zone. Typical doping in the active layer might be below $5 \times 10^{15}$ p-type with the contact zone more than $10^{17}$ p-type, with or without a band gap increase in the contact zone of several times kT.

The excluding layer may be several microns thick, sufficient to minimise the in-diffusion of minority carriers from the biasing contact itself.

The active layer may be several microns thick. It is usual to make it not much more than the diffusion length of the minority carrier in the active zone, and preferably much less. For a p-type active layer, five microns might be a typical value. For n-type doping, typical values would be much less (less than two microns). This aspect is addressed in patent publication EP0401 352B1.

Suppression will occur to some degree, whatever the length of the active layer. The active layer is terminated by a second contact zone, with doping of opposite type as in a junction. Again, the lower minority carrier concentration in this final layer, the better, and similar specifications apply to this as do to the first contact zone (except that the doping is of the opposite type).

With the bias in the same direction as before, minority carriers are captured at the interface and cannot return (in this case because of the usual barrier which exists in a reverse biased junction). Minority carriers migrate to the junction partly under the influence of the bias electric field, and partly by diffusion. Such an interface between two zones, which allows carriers to pass between zones in one direction but not the other but the other is called an extraction interface. Not all three layer devices have exclusion and extraction interfaces. If the doping and band gap conditions are not appropriate, then the application of a reverse bias will result in depletion. The conditions required for depletion for a PIN device are described in EP-A-0193 462.

The overall effect is that minority carriers are removed at the extracting contact and are not resupplied at the excluding contact. The original concentration of minority carriers is large: near the intrinsic concentration. After the application of bias it can be very low, typically below $10^{13}$, and often much lower depending on doping and bias. This low concentration contributes insignificantly to the space charge balance so that the removal of the vast proportion of the minority carriers is accompanied by a loss of a corresponding number of majority carriers leaving a space charge balance comprising minority carriers (very small) and majority carriers close in concentration to the ionized doping concentration in the active zone.

These concentrations are typical of the cooled state, the active zone is in an extrinsic condition and devices can be constructed which capitalise on this.

Leakage current is present. Some of this is due to residual thermal and optical generation in the active zone. Although thermal generation rates are vastly reduced ("Auger suppression" due to reduced carrier concentrations) they are not reduced to zero. The more ideally are the doping considerations specified above met, the lower this will be. In addition to the above, there are other contributions to the leakage current.

At the extraction junction there can be current leakage because the minority carrier concentration in the extracting contact zone is not low enough. If the doping at the interface is significantly graded, say over 0.5 microns, there will be a region close to the junction of low doping and therefore relatively high minority carrier concentration. Thermal generation will lead to leakage current in the normal manner of an imperfect junction diode.

Similarly, at the excluding junction there may be a graded interface with a short region of low doping/low bandgap which does not satisfy the preferred specification, leading to unwanted carrier generation and leakage.

A further effect is the Debye-screened spill-over of carriers from a high doped region to a low-doped region, effectively grading even the sharpest of metallurgical interfaces and introducing minority carrier generation in the tail of such a graded interface.

Even more difficulties can occur because of co-located rapid changes of doping and band gap which can give rise to temporary interruptions in the otherwise regular switches in the levels of the band edges (so-called 'glitches') which can impede the proper flow of device currents.

According to this invention a diode comprises multiple epitaxial layers semiconductor material including:

a first outer layer of heavily doped p-type material;

an active layer of lightly doped semiconducting material; and a second outer layer of heavily doped n-type material, characterised by the diode further comprising:

a first buffer layer of lightly doped p-type material; and a second buffer layer of lightly doped n-type material;

the layers being arranged in a stack with the first buffer layer being sandwiched between the active layer and the first outer layer and forming, when a reverse bias is applied, an extracting interface with each, and the second buffer layer being sandwiched between the active layer and the second outer layer and forming, when a reverse bias is applied, an excluding interface with each.

Preferably the the active layer is n-type or p-type material.

More preferably both the first buffer layer and the second buffer layer have doping concentrations that are close to or equal to the doping concentration in the active layer, the bandgaps of said active layer and buffer layers being such that the minority carrier concentration in each of said buffer layers is less than one tenth of the minority carrier concentration in said active layer.

In a further preferred embodiment, the doping concentration in the heavily doped layers is greater than $2\times10^{17}$ cm$^{-3}$.

In a further preferred embodiment the doping concentration in the active layer is less than $5\times10^{16}$ cm$^{-3}$.

Advantageously the semiconducting material is a cadmium mercury telluride compound having the formula $Hg_{(1-x)}Cd_x$Te wherein $0<x<1$.

Conveniently the transition between the heavily doped semiconducting material and the lightly doped semiconducting material takes place over a distance of several microns.

Preferably the thickness of the active layer is less than or equal to the diffusion length of the minority carder. More preferably the thickness of the active layer is less than 5 $\mu$m. Yet more preferably the thickness of the active layer is less than 2 $\mu$m.

Advantageously the diode further comprises a substrate that is in contact with the one of the outer layers.

Conveniently the substrate is in contact with the first outer layer.

In a further preferred embodiment the doping concentration in the active layer is less than $5\times10^{16}$ cm$^{-3}$. The doping concentration each buffer layer would be between that of the active layers and the heavily doped layer to which it is adjacent and preferably close to that of the active layer.

Throughout this specification, the terms "extracting" and "excluding", when applied to interfaces between layers in a device, should be construed as indicating the nature of the interface with respect to the active layer of the device. Moreover although, in the specific embodiment presented, a p-type active layer is shown, this should not be seen as limiting: the invention is equally applicable to devices with an n-type active layer wherein the roles of the other n and p-type layers would be reversed with respect to the example given.

The invention provides a device which is suitable for incorporation by hybridization, growth in situ or otherwise in a variety of electronic devices, such as a hybridized detector or an active circuit element such as a high speed FET.

The invention will now be described by way of non-limiting example with reference to FIG. 1 which shows a schematic representation of an Auger Suppressed photodiode having a device structure which is typical of the prior art and FIG. 2 which shows a schematic representation of a photodiode having a device structure which is typical of the invention.

Referring to FIG. 1, a typical Auger suppressed device of the prior art 1 comprises a multi-layer structure having a lightly doped active(n-type) layer, 2 a heavily doped layer 3 of n-type material forming and excluding interface with the active layer 2, and a heavily doped, high band gap, layer 4 of p-type material forming an extracting interface with the active layer 2.

The layer structure is grown on a suitable substrate 5 by standard deposition techniques known to those skilled in the art, for example chemical vapour deposition. Electrodes 6 facilitate the application of a voltage to the device.

Figure 2:
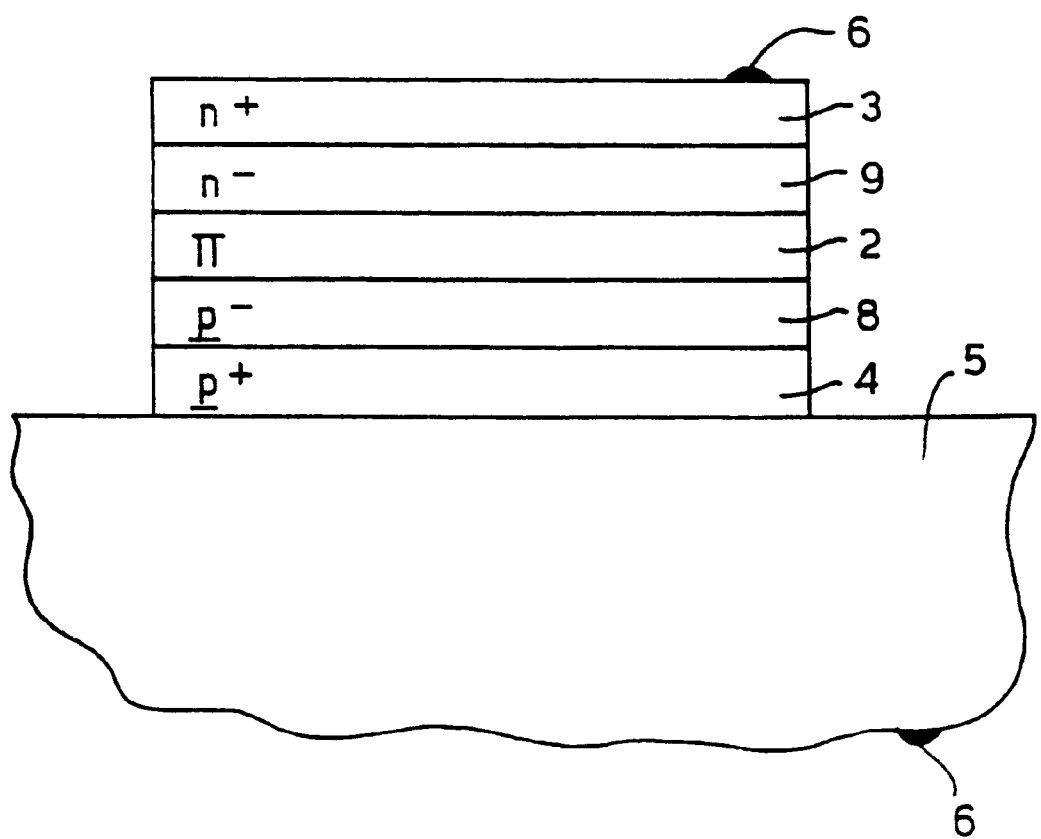

Referring to FIG. 2, a device of the current invention 7 includes items 2–6 performing a similar role to those in the device of FIG. 1. In addition, the device of the current invention comprises a lightly doped p-type buffer layer 8 and a lightly doped n-type buffer layer 9 arranged so that layers 9 and 3 form a composite contact zone as do layers 8 and 4. Buffer layers 8 and 9 have a high bandgap relative to that of active layer 2.

The reduced doping in the contact zone arising from the inclusion of buffer layer 9 reduces the spill-over and doping tail problems at the excluding interface with active layer 2. Conveniently, the doping in layer 9 could be made close to or equal to the doping in the active layer 2. This would normally destroy the exclusion effect if the band gap is the same. The band gap is therefore increased in layer 9. In principle it could be increased so much that perfect exclusion occurs. In practice the change would need to be so great that material growth difficulties would ensue and the inevitable tail might interfere with the active zone by extending into it. Attention must be given to making the grading extremely sharp. A suitable increase in band gap might be such as to reduce the intrinsic carrier concentration by 10 to 100 times.

Further into the contact zone (the exact distance is not critical) a grade to high doping is made (layer 3). The grade may extend over several microns, this too is uncritical. In this wide gap material, the minority carrier concentration is already substantially smaller than in the active region and in the new interface to high doping (as in the prior art) is able to act as an excluding interface in its own right. Application of the bias will cause the low-doped region between the high doped zone and the active zone to be excluded efficiently, reducing the minority carrier concentration there much more (typically $10^{12}$ or less). Thus, layers 9 and 3 form an extremely efficient composite contact for the active zone, supplying no minority carriers.

In some circumstances of doping, the carrier concentration in the contact can fall so low that extraction also occurs (loss of minority carriers by diffusion from the active zone).

In a similar fashion, the doping at buffer layer 8 is kept low but with increased band gap (again such as to reduce the intrinsic carrier concentration by typically 10 to 100 times) giving rise to extraction interface between buffer layer 8 and active layer 2. The relatively heavily doped layer 4 forms a second extracting interface with buffer layer 8 to create a zone where the minority concentration falls even lower and junction leakage is prevented.

The provision of high efficiency contact zones as described here ensures that the residual range of currents of these devices are almost totally due to residual generation in the active current when biassed. This minimal current maximizes the ratio between maximum current (achieved almost before onset of exclusion/extraction) and final current, and maximizes the associated negative resistance effect Devices of the current invention can be fabricated using standard procedures such as vapour phase epitaxy. Contacts can be standard for the material employed.

Table 1 shows the structure and doping concentrations of a typical device of the invention. The material of each layer of the device is of the family $Hg_{(1-x)}Cd_x$Te and is specified by the value of x. In this table, p and n indicate the type of doping in a material. the superscripts – and + indicate light and heavy doping respectively, the underline indicates material of high band gap and $\pi$ denotes the active layer.

TABLE 1

Typical device of the Current Invention.

| Layer | Doping | x | Thickness($\mu$m). |
|---|---|---|---|
| p$^+$ | $3 \times 10^{17}$ cm$^{-3}$ As | 0.35 | 4.0 |
| p$^-$ | $1 \times 10^{15}$ cm$^{-3}$ As | 0.35 | 1.5 |
| $\pi$ | $1 \times 10^{15}$ cm$^{-3}$ As | 0.18 | 2.5 |
| n$^-$ | $1 \times 10^{16}$ cm$^{-3}$ I | 0.28 | 3.5 |
| n$^+$ | $3 \times 10^{17}$ cm$^{-3}$ I | 0.28 | 3.5 |

The structure shown in table 1 had a cut off wavelength of 9.5 $\mu$m and a minimum leakage current of 10 Am$^{-2}$.

What is claimed is:

1. A diode comprising multiple epitaxial layers of semiconducting material including:

a first outer layer (4) of heavily doped p-type material;

an active layer (2) of lightly doped semiconducting material; and a second outer layer (3) of heavily doped n-type material, characterised by the diode further comprising:

a first buffer layer (8) of lightly doped p-type material; and a second buffer layer (9) of lightly doped n-type material; the layers (2, 3, 4, 8, 9) being arranged in a stack with the first buffer layer (8) being sandwiched between the active layer (2) and the first outer layer (4) and forming, when a reverse bias is applied, an extracting interface with each, and the second buffer layer (9) being sandwiched between the active layer (2) and the second outer layer (3) and forming, when a reverse bias is applied, an excluding interface with each.

2. A diode according to claim 1 wherein the active layer (2) is n-type material.

3. A diode according to claim 1 wherein the active layer (2) is p-type material.

4. A diode according to claim 1 wherein both the first buffer layer (8) and the second buffer layer (9) have doping concentrations that are close to or equal to the doping concentration in the active layer, the bandgaps of said active layer (2) and buffer layers (8, 9) being such that the minority carrier concentration in each of said buffer layers (8, 9) is less than one tenth of the minority carrier concentration in said active layer (2).

5. A diode according to claim 1 wherein the doping concentration in the heavily doped material is greater than $2 \times 10^{17}$ cm$^{-3}$.

6. A diode according to claim 1 wherein the doping concentration in the active layer is less than $5 \times 10^{16}$ cm$^{-3}$.

7. A diode according to claim 1 wherein the semiconducting material is a cadmium mercury telluride compound having the formula Hg$_{(1-x)}$Cd$_x$Te wherein 0<x<1.

8. A diode according to claim 1 wherein the transition between the heavily doped semiconducting material and the lightly doped semiconducting material takes place over a distance of several microns.

9. A diode according to claim 1 wherein the thickness of the active layer (2) is less than or equal to the diffusion length of the minority carrier.

10. A diode according to claim 9 wherein the thickness of the active layer (2) is less than 5 $\mu$m.

11. A diode according to claim 10 wherein the thickness of the active layer (2) is less than 2 $\mu$m.

12. A diode according to claim 1 wherein the diode further comprises a substrate (5) that is in contact with the one of the outer layers (3, 4).

13. A diode according to claim 12 wherein the substrate (5) is in contact with the first outer layer (4).

* * * * *